United States Patent
Inenaga et al.

(10) Patent No.: US 7,542,496 B2
(45) Date of Patent: Jun. 2, 2009

(54) SEMICONDUCTOR LASER DEVICE, LIGHT SCANNER, AND IMAGE FORMING APPARATUS

(75) Inventors: Hiroshi Inenaga, Hitachinaka (JP); Junshin Sakamoto, Hitachinaka (JP)

(73) Assignee: Ricoh Company, Ltd., Tokyo (JP)

( * ) Notice: Subject to any disclaimer, the term of this patent is extended or adjusted under 35 U.S.C. 154(b) by 47 days.

(21) Appl. No.: 11/937,690

(22) Filed: Nov. 9, 2007

(65) Prior Publication Data

US 2008/0112729 A1  May 15, 2008

(30) Foreign Application Priority Data

Nov. 10, 2006 (JP) ............ 2006-305133
Oct. 16, 2007 (JP) ............ 2007-269038

(51) Int. Cl.
*H01S 3/04* (2006.01)
*H01S 5/00* (2006.01)

(52) U.S. Cl. .................. 372/36; 372/50.12
(58) Field of Classification Search .......... 372/36, 372/50.12
See application file for complete search history.

(56) References Cited

U.S. PATENT DOCUMENTS 5,923,692 A * 7/1999 Staskus et al. ......... 372/50.12
6,804,276 B2 * 10/2004 Gen-ei et al. ............ 372/36

FOREIGN PATENT DOCUMENTS

JP 05-315705 A 11/1993
JP 2006-259851 A 9/2005

OTHER PUBLICATIONS

Atsumi, Kinya et al., "Highly Reliable High Power Diode Laser for Laser Radar Application", vol. 9, No. 2 (2004)(pp. 88-94).

* cited by examiner

*Primary Examiner*—Matthew Luu
*Assistant Examiner*—Kendrick X Liu
(74) *Attorney, Agent, or Firm*—Crowell & Moring LLP

(57) ABSTRACT

A semiconductor laser device including an edge-emitting type laser chip having at least three emitting points in one light emitting edge, a sub-mount mounted with the laser chip, and a heat sink bonded to the sub-mount through a solder layer. When R designates a linear expansion coefficient ratio of the heat sink to the sub-mount and D designates a distance between light emitting points at opposite ends in the light emitting edge of the laser chip, materials of the sub-mount and the heat sink and the distance D are set to satisfy the following relation:

$$D \leq 5.48 \times R^{-2.13}$$

A difference between stress acting on one laser element and another in the laser chip due to shrinkage of the heat sink when melted solder is cooled down is reduced so that a difference in light output characteristics between one light emitting point and another can be reduced.

6 Claims, 4 Drawing Sheets

SEMICONDUCTOR LASER DEVICE, LIGHT SCANNER, AND IMAGE FORMING APPARATUS

FIELD OF THE INVENTION

The present invention relates to a semiconductor laser device which is for use in optical communication, a laser printer or the like and which has an edge-emitting type laser chip for emitting a plurality of laser beams, a light scanner using the semiconductor laser device, and an image forming apparatus using the laser scanner.

BACKGROUND OF THE INVENTION

In a semiconductor laser device having an edge-emitting type laser chip, a plurality of laser elements electrically isolated from one another by isolation grooves on a main surface of a semiconductor substrate are formed in an array. The semiconductor substrate is, for example, made of gallium arsenide. The semiconductor substrate is mounted on an laser chip mounting area of a main surface of a sub-mount so that the semiconductor substrate falls on its main surface. The sub-mount is, for example, made of silicon carbide. In the laser chip mounting area of the sub-mount, a plurality of electrodes are disposed oppositely to electrodes of the laser chip respectively. Solder layers are formed on the surfaces of the plurality of electrodes respectively. Through the solder layers, the electrodes of the laser elements are electrically and mechanically connected to the electrodes of the sub-mount respectively.

On another area of the sub-mount than the laser chip mounting area, a plurality of bonding pads for connections with bonding wires are formed in positions where the wires will not block laser beams when the wires are attached. The other ends of the bonding wires are connected respectively to one-end sides of a plurality of leads which are provided to penetrate a flange of a package and electrically isolated from the flange. Thus, a current can be applied from the outside of the package to each semiconductor laser element.

In order to suppress heating of the laser elements, the sub-mount is bonded to a heat sink which is made of a highly thermal conductive material such as copper. Further, the heat sink is mechanically bonded to the flange portion by brazing.

To improve the yield of the semiconductor laser device, however, there is a problem that the laser chip is stressed due to a difference in linear expansion coefficient between the sub-mount and the heat sink. The difference may appear when the sub-mount mounted with the laser chip is bonded to the heat sink.

Assume that gallium arsenide is used as the primary component of the laser chip, silicon carbide or aluminum nitride is used for the sub-mount, and copper, copper-tungsten or the like is used for the heat sink. In this case, as is apparent from Table 1, there is a large difference in linear expansion coefficient between the sub-mount and the heat sink.

The sub-mount and the heat sink are generally bonded by soldering with a die bonder. That is, a small piece of foil-like solder is placed on the heat sink, and the sub-mount is then positioned suitably relatively to the heat sink so as to cover the small piece of solder. The sub-mount is pressed and fixed by a pressing jig. The whole of a work including the sub-mount and the heat sink is heated to a temperature not lower than the melting point of the solder by a heater. Thus, the small piece of solder is melted to bond the sub-mount and the heat sink.

During the heating, the small piece of solder between the heat sink and the sub-mount is melted into liquid. The sub-mount has not yet been bonded to the heat sink till then. Therefore, the heat sink and the sub-mount bonded with the laser chip expand individually. On the other hand, the laser chip and the sub-mount have been already bonded. Accordingly, the sub-mount is deformed in conformity with the expansion of the laser chip having a large linear expansion coefficient. However, the sub-mount is not a light emitting element. In addition, the difference in linear expansion coefficient between the laser chip and the sub-mount is small. Therefore, stress acting on the sub-mount at this time causes no problem.

Next, the heater is turned off, and nitrogen gas is blown against the work so as to cool the work. When the temperature of the work is below the melting point of the solder, the sub-mount and the heat sink are bonded by the solder. After that, the nitrogen gas is blown till the temperature of the work is below about 100° C. After the blowing of the nitrogen gas is terminated, the work is cooled down to the room temperature which is, for example, set at 25° C.

During the cooling, the heat sink and the sub-mount are bonded, and the sub-mount and the laser chip are bonded. As the temperature drops down, the sub-mount and the laser chip are deformed in conformity with the shrinkage of the heat sink having the largest linear expansion coefficient. Thus, stress occurs in proportion to the quantity of the deformation.

With reference to deformation at a high-temperature when the solder between the sub-mount and the heat sink is melted, the peripheral portion of the heat sink is deformed more largely than the central portion thereof with the decrease of the temperature as shown in FIGS. 4A and 4B.

The laser chip and the sub-mount are also deformed with the shrinkage of the heat sink. As for the laser chip and the sub-mount, therefore, their peripheral portions are deformed more largely then their central portions respectively.

Assume that there are three light emitting points 6 in one light emitting edge as shown in FIGS. 4A and 4B. In this case, it is understood that there is a difference in quantity of deformation between the light emitting point at the center and each of the light emitting points at the opposite ends. Stress acts on an active layer including a light emitting point in the laser chip in proportion to the quantity of deformation. Therefore, there occurs a difference in stress between the light emitting point at the center and each of the light emitting points at the opposite ends.

The stress acting on the active layer affects light output characteristics such as an oscillatory wavelength, a threshold current, etc. It is also known that the stress affects reliability such as a life length or the like as disclosed in Non-Patent Document 1. Therefore, there occurs a difference between the light emitting point at the center and each of the light emitting points at the opposite ends as to light output characteristics such as an oscillatory wavelength, a threshold current, etc. or reliability such as a life length or the like.

For example, when the semiconductor laser device is applied to a writing light source in a laser printer, there is a problem that the difference in oscillatory wavelength appears as a difference in image position or image spot diameter between one laser beam and another, and the difference in threshold current makes it difficult to control the light outputs of laser beams.

There is another problem. That is, with increase of a distance D between the light emitting points at the opposite ends, a difference in light output characteristics such as an oscillatory wavelength or a threshold current between the light emitting point at the center and each of the light emitting points at the opposite ends is enlarged. Thus, reliability such as a life length as a semiconductor laser device having three light emitting points deteriorates extremely.

Lead-tin solder which has been often used for bonding a sub-mount and a heat sink in the background art contains lead. Lead was designated as a toxic substance in the EU RoHS Directive which was effective in July 2006. It will be therefore difficult to use the lead-tin solder in the future. For this reason, silver-tin solder, gold-tin solder, etc. are often used as solder materials. The melting point of the lead-tin solder is about 180° C., while the melting point of the silver-tin solder is about 230° C. and the melting point of the gold-tin solder reaches 280° C. As the melting point of the solder increases, a change in temperature during heating and cooling is enlarged so that the shrinkage of the heat sink during the cooling also increases. Thus, stress acting on the laser chip also increases.

In a multi-channel laser chip, the distance D between the light emitting points at the opposite ends of the laser chip may increase further. Assume that L designates a length of a substance, α designates a linear expansion coefficient of the substance, and ΔT designates a change of temperature of the substance. A length change ΔL of the substance in the temperature change ΔT can be expressed by:

$$\Delta L = L \times \alpha \times \Delta T$$

As is understood from this, stress acting on the laser chip is enlarged in proportion to the distance between the light emitting points at the opposite ends in the laser chip.

Though not shown in FIGS. 4A and 4B, assume that there are two light emitting points in one light emitting edge. The two light emitting points are generally disposed symmetrically with respect to a central line which is not shown in FIGS. 4A and 4B. Due to the symmetric arrangement, there occurs no difference in quantity of deformation due to decrease of temperature between the two light emitting points. When there is one light emitting point in one light emitting edge, the light emitting point is generally disposed at the center of the laser chip. Therefore, the quantity of deformation due to decrease of temperature is slight.

As has been described above, it is understood that the problem of the action of stress on an active layer including a light emitting point and the difference in stress between one light emitting point and another due to decrease of temperature during cooling when a sub-mount and a heat sink are bonded by soldering is conspicuous when there are three or more light emitting points in one light emitting edge.

The problem described above has been already known. Solutions to the problem have been proposed.

Patent Document 1 (JP-A-2005-259851) discloses a method in which a groove is provided in a surface of a sub-mount in contact with a heat sink so as to reduce the contact area between the sub-mount and the heat sink and thereby reduce deformation in the sub-mount and a laser chip. However, the shape of the sub-mount is so complicated that it is more difficult to mold the sub-mount. Thus, there is a problem that the cost increases. Solder enters the groove in the lower portion of the sub-mount when the sub-mount and the heat sink are bonded. Thus, there is another problem that a larger quantity of solder is required in comparison with that in a sub-mount with no groove.

Patent Document 2 (JP-A-5-315705) discloses a method using a configuration where a difference between a laser chip and a sub-mount as to values obtained by multiplying their linear expansion coefficients by the resonator length of a laser element respectively is not larger than a predetermined value. When this is applied to the present invention, the resonator length of a laser element can be regarded as a distance between light emitting points at opposite ends in a laser chip. As described herein, however, only reduction of the difference in linear expansion coefficient between a laser chip and a sub-mount is not effective to reduce the deformation of a heat sink due to cooling when the sub-mount is bonded thereto.

A semiconductor laser device may have a configuration where a laser chip is bonded to a heat sink without putting a sub-mount therebetween. In this case, for example, assume that gallium arsenide is used for the laser chip, and copper-tungsten is used for the heat sink. By this configuration, the linear expansion coefficient ratio of the heat sink to the laser chip can be suppressed to be low. Stress acting on an active layer including a light emitting point due to decrease of temperature during cooling when the laser chip and the heat sink are bonded by soldering is slight, and a difference in stress between one light emitting point and another counts for nothing.

Non-Patent Document 1: Atsumi and other three, "High-Power Laser Diode for Automotive Laser Radar", Denso Technical Review, Vol. 9, No. 2, 2004

Patent Document 1: JP-A-2005-259851

Patent Document 2: JP-A-5-315705

SUMMARY OF THE INVENTION

An object of the present invention is to provide a semiconductor laser device with a heat sink on which an edge-emitting type laser chip having three or more light emitting points in one light emitting edge is mounted through a sub-mount, wherein when melted solder is cooled down in the step of bonding the sub-mount to the heat sink by soldering, stress acting on laser elements of the laser chip due to shrinkage of the heat sink and a difference between stress acting on one laser element and stress acting on another are reduced so that a difference in light output characteristics between one light emitting point and another can be reduced, and reliability can be improved.

In order to attain the object, a first configuration of the present invention provides a semiconductor laser device including an edge-emitting type laser chip having at least three light emitting points in one light emitting edge, a sub-mount mounted with the laser chip, and a heat sink made of a highly thermal conductive material and bonded to the sub-mount through a solder laser. The semiconductor laser device is characterized in that:

when R designates a linear expansion coefficient ratio of the heat sink to the sub-mount [(linear expansion coefficient of the heat sink)/(linear expansion coefficient of the sub-mount)] and D (mm) designates a distance between light emitting points at opposite ends in the light emitting edge of the laser chip, materials of the sub-mount and the heat sink and the distance D are set to satisfy the following relation:

$$D \leq 5.48 \times R^{-2.13}$$

A second configuration of the present invention is based on the first configuration, and characterized in that the linear expansion coefficient ratio R of the heat sink to the sub-mount is not lower than 1.

A third configuration of the present invention is based on the first or second configuration, and characterized in that aluminum nitride or silicon carbide is used for the sub-mount, and copper-tungsten is used for the heat sink.

A fourth configuration of the present invention is based on any one of the first through third configurations, and characterized in that silver-tin solder or gold-tin solder is used for the solder layer.

A fifth configuration of the present invention provides a light scanner including a light source, and a rotary polygon mirror with a reflective surface for deflecting a light beam from the light source so as to perform scanning therewith. The light scanner is characterized in that the light source is a semiconductor laser device according to any one of the first through fourth configurations.

A sixth configuration of the present invention provides an image forming apparatus including a photoconductor, a charger for charging the photoconductor, a light scanner for scanning the photoconductor with a light beam to thereby form an electrostatic latent image on the photoconductor, a developing unit for applying toner to the electrostatic latent image to thereby form a toner image, a transfer unit for transferring the toner image onto a recording medium, and a fixing unit for fixing the transferred toner image onto the recording medium. The image forming apparatus is characterized in that the light scanner is a light scanner according to the fifth configuration.

According to the present invention, in a semiconductor laser device with a heat sink on which an edge-emitting type laser chip having at least three emitting points in one light emitting edge is mounted through a sub-mount, when melted solder is cooled down in the step of bonding the sub-mount to the heat sink by soldering, stress acting on laser elements of the laser chip due to shrinkage of the heat sink and a difference between stress acting on one laser element and stress acting on another are reduced so that a difference in light output characteristics between one light emitting point and another can be reduced, and reliability can be improved.

DETAILED DESCRIPTION OF THE EMBODIMENTS

Figure 1:
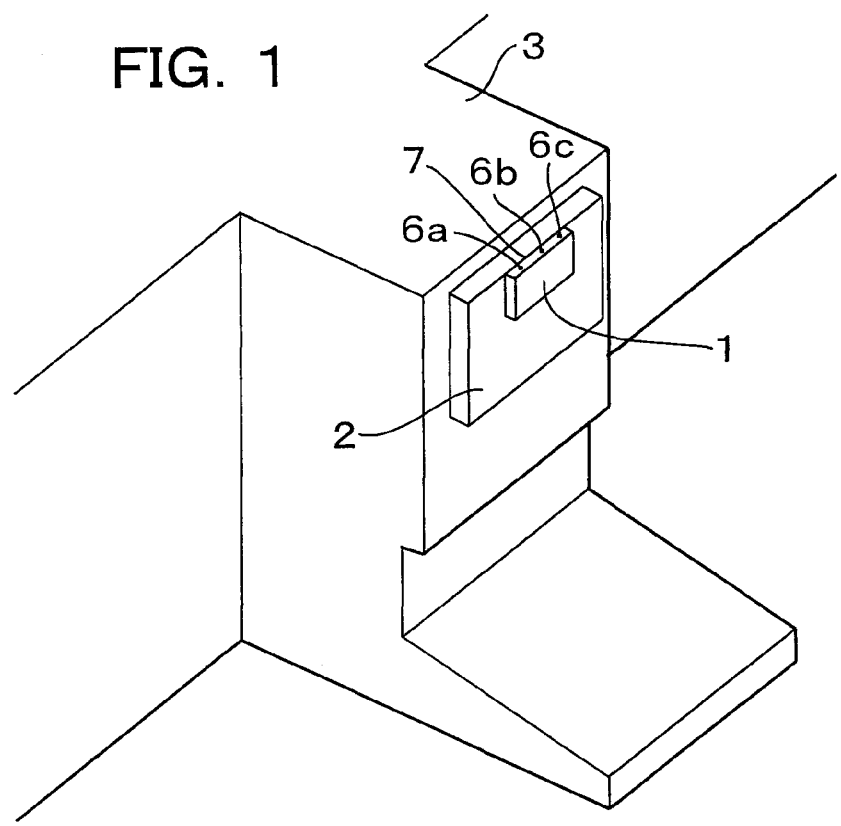
FIG. 1 is an enlarged perspective view showing the vicinity of a laser chip of a semiconductor laser device according to an embodiment of the present invention.
Figure 2:
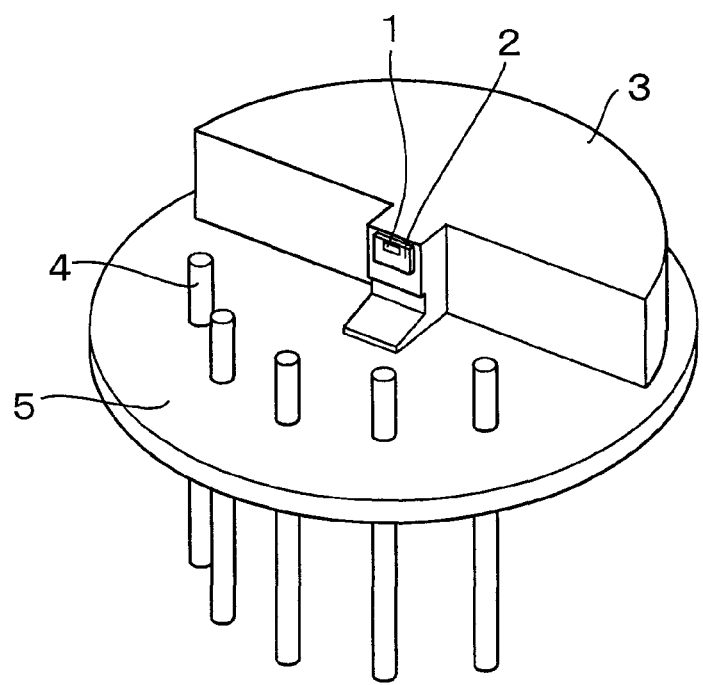
FIG. 2 is a perspective view of the whole of the semiconductor laser device.
Figure 3:
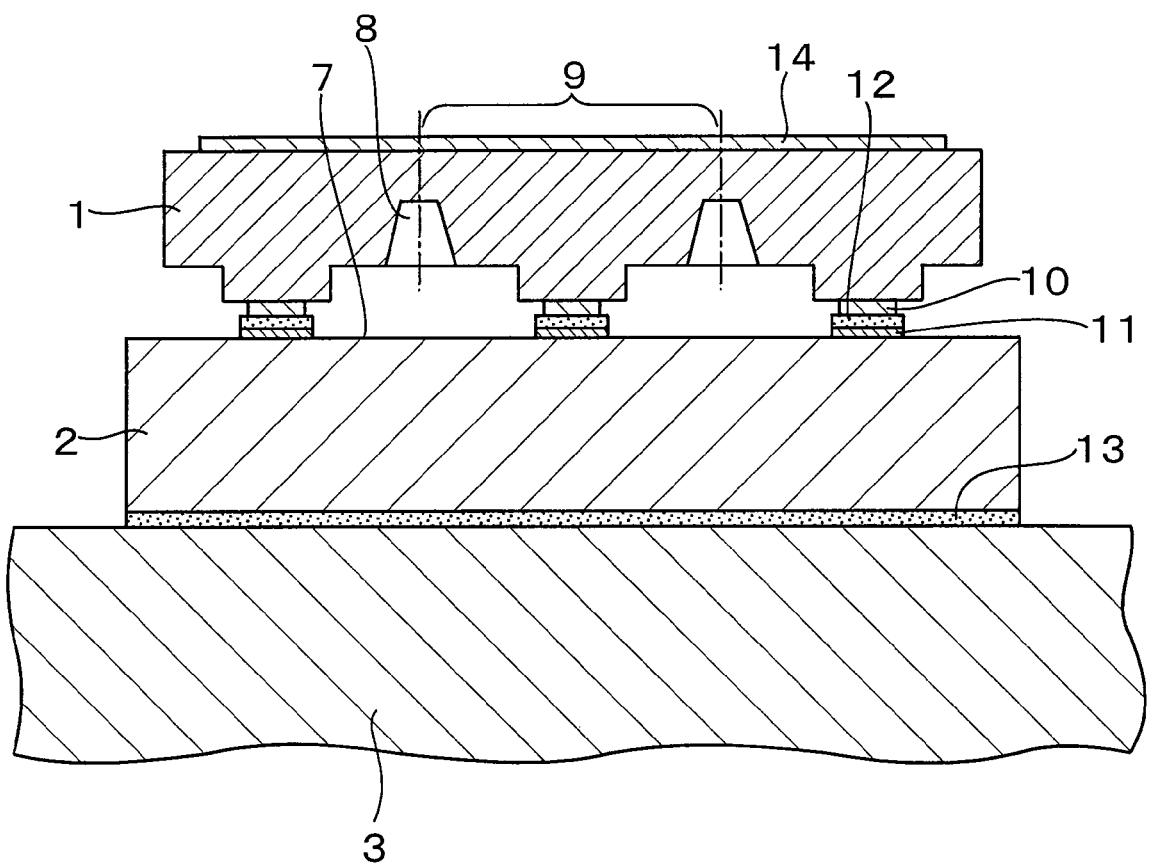
FIG. 3 is a partially enlarged sectional view of the semiconductor laser device.

Next, an embodiment of the present invention will be described with reference to the drawings. FIG. 1 is an enlarged perspective view showing the vicinity of a laser chip of a semiconductor laser device according to this embodiment. FIG. 2 is a perspective view of the whole of the semiconductor laser device. FIG. 3 is a partially enlarged sectional view of the semiconductor laser device.

A plurality of laser elements 9 electrically isolated from one another by isolation grooves 8 are provided into an array on a main surface of a semiconductor substrate as shown in FIG. 3. Thus, a laser chip 1 is formed. The laser chip 1 is mounted on a laser chip mounting area 7 of a sub-mount 2 so that the laser chip 1 falls on its main surface. The isolation grooves are provided in this embodiment, but no isolation groove may be provided in some case.

A plurality of electrodes 11 are formed in the laser chip mounting area 7 of the sub-mount 2 so as to face electrodes 10 of the laser chip 1 respectively. Solder layers 12 are formed on the electrodes 11 respectively in advance. Through the solder layers 12, the electrodes 10 and the electrodes 11 are electrically and mechanically connected respectively.

In order to suppress heating of the laser chip 1 (laser elements 9), the sub-mount 2 mounted with the laser chip 1 in such a manner is mechanically bonded to a heat sink 3 which is made of a highly thermal conductive material (see FIG. 3). Further, the heat sink 3 is mechanically bonded to a flange 5 by brazing (see FIG. 2). In FIG. 3, the reference numeral 14 represents a common electrode.

On another area of the sub-mount 2 than the laser chip mounting area 7, a plurality of bonding pads (not shown) are formed. On the other hand, a plurality of leads 4 which are electrically isolated from the flange 5 of a package are provided to penetrate the flange 5. One-side ends of the leads 4 are connected to the bonding pads through bonding wires respectively. Thus, a current can be applied from the outside of the package to each laser element 9.

When the sub-mount 2 is bonded to the heat sink 3, the melted solder layers 13 are cooled down. The sub-mount 2 and the laser chip 1 have been bonded before. In the cooling process, therefore, with decrease of temperature, the sub-mount 2 and the laser chip 1 are deformed in conformity with shrinkage of the heat sink 3 having the largest linear expansion coefficient so that stress acts thereon in proportion to the quantity of the deformation.

Figure 4A:
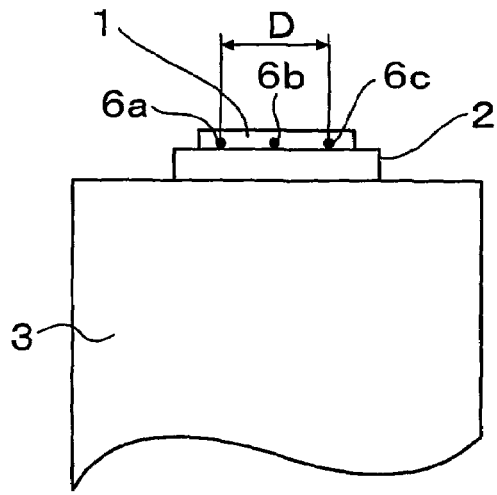
FIGS. 4A and 4B are explanatory views showing deformations of members caused by solder bonding between a sub-mount and a heat sink.
Figure 4B:
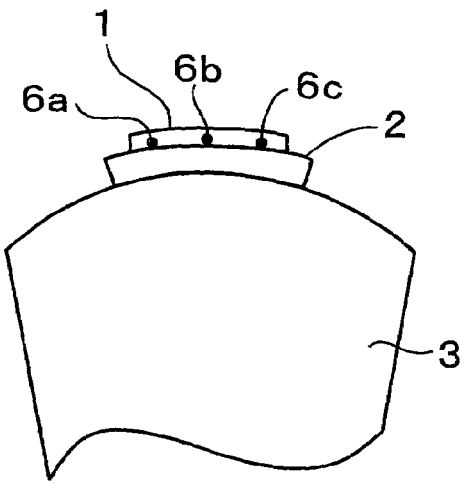

FIGS. 4A and 4B are explanatory views showing deformations of members caused by solder bonding between the sub-mount 3 and the heat sink 2. FIG. 4A shows a state where the solder is melted, and FIG. 4B shows a state where the solder has been hardened.

With reference to deformation at a high temperature when the solder between the sub-mount 3 and the heat sink 2 is melted as shown in FIG. 4A, the peripheral portion of the heat sink 3 on the opposite sides of the central portion thereof is deformed more largely than the central portion as shown in FIG. 4B. As for the laser chip 1 and the sub-mount 2, the peripheral portions of the laser chip 1 and the sub-mount 2 on the opposite sides of their central portions are also deformed more largely then the central portions respectively with the shrinkage of the heat sink 3.

Assume that there are three light emitting points 6a-6c on a straight line and at an equal interval in one light emitting edge as shown in FIG. 4A. In this case, there is a difference between the quantity of deformation in the light emitting point 6b at the center and that in each of the light emitting points 6a and 6c at the opposite ends as the melted solder is hardened. Active layers including the light emitting points 6a-6c in the laser chip 1 are stressed in proportion to their quantities of deformation respectively. Therefore, there occurs a difference in stress between the light emitting point 6b at the center and that in each of the light emitting points 6a and 6c at the opposite ends.

Table 1 shows materials of the semiconductor laser array elements (laser chip), the sub-mount and the heat sink used in the semiconductor laser device and their linear expansion coefficients.

TABLE 1

| USED PARTS | MATERIALS | LINER EXPANSION COEFFICIENT ($\times 10^{-6}$/K) |
|---|---|---|
| SEMICONDUCTOR LASER ARRAY ELEMENTS | GALLIUM ARSENIDE | 6.5 |

TABLE 1-continued

| USED PARTS | MATERIALS | LINER EXPANSION COEFFICIENT ($\times 10^{-6}$/K) |
|---|---|---|
| SUB-MOUNT | SILICON CARBIDE | 3.7 |
|  | ALUMINUM NITRIDE | 4.8 |
| HEAT SINK | COPPER | 17.7 |
|  | COPPER-TUNGSTEN | 8.3 |
|  | IRON | 12.1 |

As for the difference in stress among the light emitting points 6a-6c in the laser chip 1, the present invention paid attention not to the linear expansion coefficient ratio of the heat sink to the laser chip but the linear expansion coefficient ratio R of the heat sink to the sub-mount [=(linear expansion coefficient of the heat sink)/(linear expansion coefficient of the sub-mount)]. The reason will be described. That is, the laser chip is deformed in conformity with the deformation of the sub-mount. Therefore, the linear expansion coefficient ratio of the heat sink to the sub-mount is more dominant than the linear expansion coefficient ratio of the heat sink to the laser chip.

The linear expansion coefficient ratios R were obtained in combinations of various materials for the sub-mount and the heat sink as follows.

(copper-tungsten)/(aluminum nitride)=1.73
(copper-tungsten)/(silicon carbide)=2.24
(iron)/(aluminum nitride)=2.52
(iron)/(silicon carbide)=3.27
(copper)/(aluminum nitride)=3.69
(copper)/(silicon carbide)=4.78

Thus, the linear expansion coefficient ratio R of the heat sink to the sub-mount in the present invention is not lower than 1. The linear expansion coefficient ratio R of the heat sink to the sub-mount in the present invention is preferably in a range of from 1 to 4, and more preferably in a range of from 1.7 to 3.7. In some combination of materials for the sub-mount and the heat sink, the value of the linear expansion coefficient ratio R increases. In this case, however, the allowable distance D between light emitting points becomes extremely narrow from the result of FIG. 5 which will be described later. Particularly when the number of light emitting points increases, there is a tendency to make it difficult to manufacture the laser chip. Therefore, the value of the linear expansion coefficient ratio R had better be limited in the aforementioned range.

Next, description will be made about the relationship between the linear expansion coefficient ratio R and the distance D between the light emitting points at the opposite ends in the laser chip. Various semiconductor laser devices shown in Table 2 were built while various materials were combined for the sub-mount and the heat sink and the distance D between the light emitting points was changed variously.

TABLE 2

|  | SUB-MOUNT | HEAT SINK | R | D (mm) |
|---|---|---|---|---|
| SAMPLE NO. 1 | ALUMINUM NITRIDE | COPPER-TUNGSTEN | 1.73 | 2.0 |
| SAMPLE NO. 2 | ALUMINUM NITRIDE | COPPER-TUNGSTEN | 1.73 | 1.5 |
| SAMPLE NO. 3 | SILICON CARBIDE | COPPER-TUNGSTEN | 2.24 | 1.5 |
| SAMPLE NO. 4 | SILICON CARBIDE | COPPER-TUNGSTEN | 2.24 | 1.0 |
| SAMPLE NO. 5 | SILICON CARBIDE | COPPER-TUNGSTEN | 2.24 | 0.6 |
| SAMPLE NO. 6 | ALUMINUM NITRIDE | IRON | 2.52 | 1.0 |
| SAMPLE NO. 7 | ALUMINUM NITRIDE | IRON | 2.52 | 0.8 |
| SAMPLE NO. 8 | SILICON CARBIDE | IRON | 3.27 | 0.8 |
| SAMPLE NO. 9 | SILICON CARBIDE | IRON | 3.27 | 0.4 |
| SAMPLE NO. 10 | ALUMINUM NITRIDE | COPPER | 3.69 | 0.6 |
| SAMPLE NO. 11 | ALUMINUM NITRIDE | COPPER | 3.69 | 0.3 |
| SAMPLE NO. 12 | SILICON CARBIDE | COPPER | 4.78 | 0.6 |
| SAMPLE NO. 13 | SILICON CARBIDE | COPPER | 4.78 | 0.15 |

Figure 5:
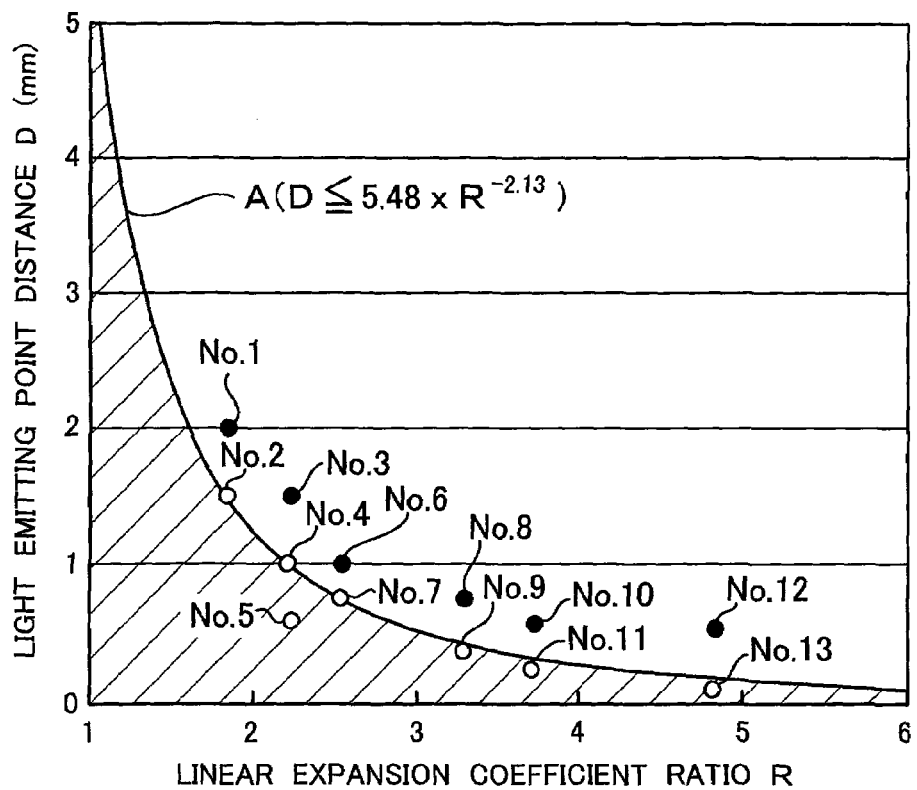
FIG. 5 is a graph showing the relationship between a linear expansion coefficient ratio R and a distance D between light emitting points.

FIG. 5 is a graph showing the relationship between the linear expansion coefficient ratio R and the distance D between the light emitting points. Sample No. of each semiconductor laser device in Table 2 is attached to its corresponding sample in FIG. 5. From other pilot studies performed by the present inventor and others, it turned out that any stress acting on the laser elements due to solder bonding between the sub-mount and the heat sink will have no influence such as deterioration of their light output characteristics or shortening of their lives if the stress is not beyond 35 kgf/mm².

Stress acting on laser elements of a semiconductor laser device of each sample No. 1-13 was obtained. The sample was marked with a sign ○ when the stress acting thereon was not higher than 35 kgf/mm². The sample was marked with a sign • when the stress acting thereon was higher than 35 kgf/mm². Thus, the samples were classified.

As is apparent from this result, in each sample in the shaded region below the curve A in FIG. 5, that is, in each sample where the relationship between the linear expansion coefficient ratio R and the distance D between the light emitting points is expressed by the following expression, the stress acting on laser elements due to solder bonding between the sub-mount and the heat sink is not higher than 35 kgf/mm². Therefore, those samples are semiconductor laser devices where deterioration in their light output characteristics, shortening of their lives and so on can be suppressed.

$$D \leq 5.48 \times R^{-2.13}$$

When an edge-emitting type laser chip is used in the embodiment of the present invention, the laser chip has about 3-20 light emitting points by way of example.

Figure 6:
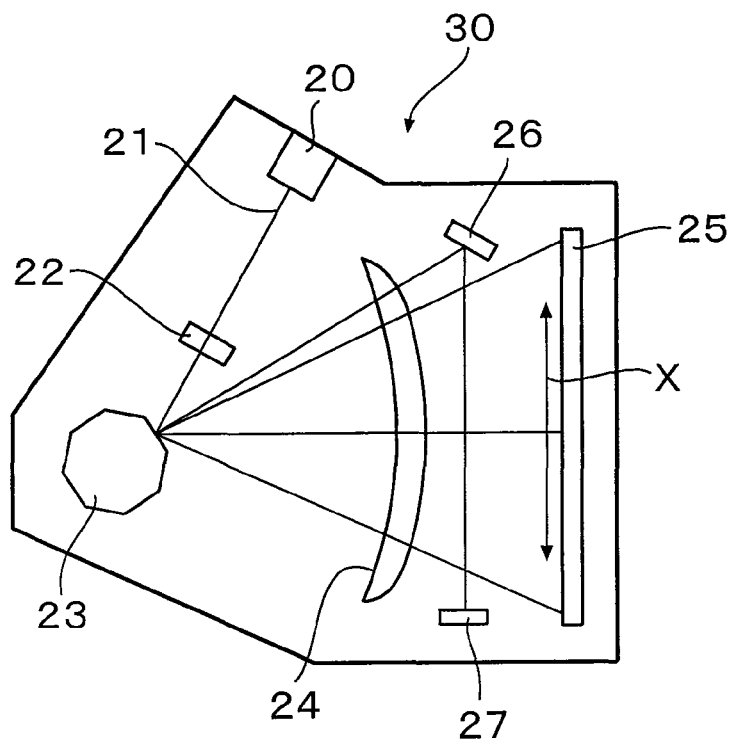
FIG. 6 is a schematic configuration view of a light scanner according to an embodiment of the present invention.

FIG. 6 is a schematic configuration view of a light scanner using the semiconductor laser device according to the aforementioned embodiment. The aforementioned semiconductor laser device is used as a writing light source 20 of a light scanner 30. A laser beam 21 emitted from the writing light source 20 passes through a cylindrical lens 22 having a predetermined curvature only in a sub-scanning direction. The laser beam 21 is deflected by a rotary polygon mirror 23 so as to perform a scan. The laser beam 21 passes through an Fθ lens 24, and reflected downward in FIG. 6 by a folding mirror 25. The laser beam 21 is focused on a photoconductor (not shown) disposed under the folding mirror 25. Thus, an electrostatic latent image is formed on the photoconductor. Based on the electrostatic latent image, an image can be formed as will be described later. The arrow X in FIG. 6 designates a scanning direction (main scanning direction) of the laser beam 21. A part of the laser beam 21 deflected to perform a scan is introduced into an optical sensor 27 by a mirror 26. In response to an output signal from the optical sensor 27, modulation is started for writing with the beam emitted from the writing light source 20.

Figure 7:
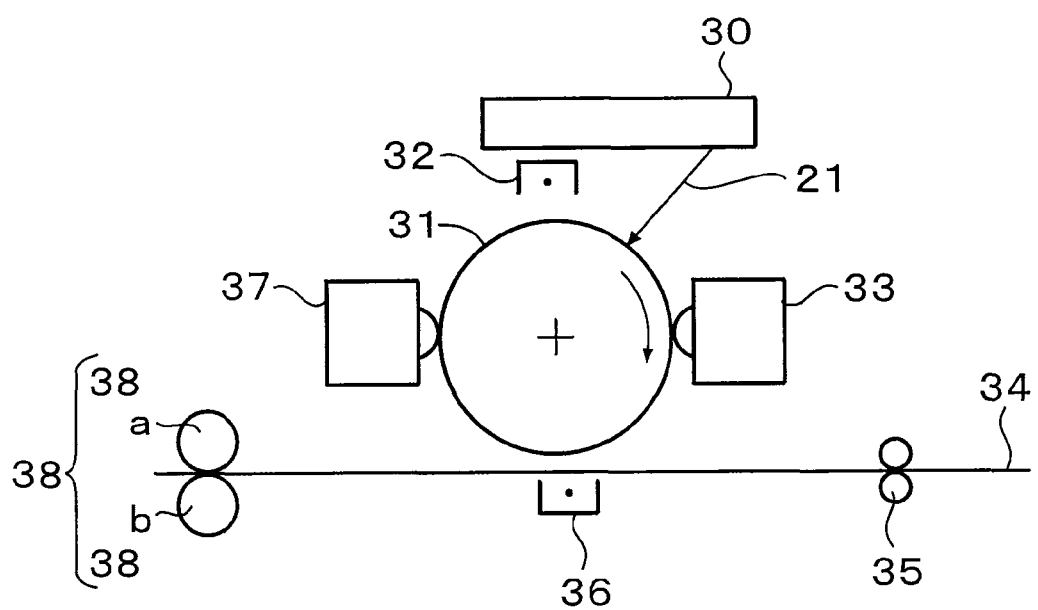
FIG. 7 is a schematic configuration view of an image forming apparatus according to an embodiment of the present invention.

FIG. 7 is a schematic configuration view of an image forming apparatus using the light scanner 30.

A drum-like photoconductor 31 for forming a toner image is driven to rotate at a fixed peripheral velocity by a not-shown motor. The photoconductor 31 is charged uniformly by a charger 32, and then exposed to the laser beam 21 from the light scanner 30 so as to form an electrostatic latent image corresponding to image information to be recorded. A developing unit 33 is disposed on the rotation-direction downstream side of the position where the photoconductor 31 is exposed. Toner is applied onto the photoconductor 31 by the developing unit 33 so as to form a toner image thereon.

Printing paper 34 is conveyed by a conveyance unit 35 such as conveyance rollers. The back surface of the printing paper 34 is charged with reversed polarity to the polarity of the toner. Thus, the toner image on the photoconductor 31 is transferred onto the printing paper 34. After the transfer, residual toner which has not been transferred is removed by a cleaner 37. The printing paper 34 with the toner image transferred thereto is conveyed to a fixing unit 38.

The fixing unit 38 is constituted by a heating roller 38a controlled to be heated to a fixed temperature, and a pressing roller 38b brought into pressure contact with the heating roller 38a. When the printing paper 34 passes through the fixing unit 38, the toner image retained on the printing paper 34 is heated and melted. Thus, the toner image is fixed to the printing paper 34. After the fixation, the printing paper 34 is discharged to the outside of the image forming apparatus, and stocked.

What is claimed is:

1. A semiconductor laser device comprising:
   an edge-emitting type laser chip having at least three light emitting points in one light emitting edge;
   a sub-mount mounted with the laser chip; and
   a heat sink made of a highly thermal conductive material and bonded to the sub-mount through a solder laser; wherein:
   when R designates a linear expansion coefficient ratio of the heat sink to the sub-mount [(linear expansion coefficient of the heat sink)/(linear expansion coefficient of the sub-mount)], and D (mm) designates a distance between light emitting points at opposite ends in the light emitting edge of the laser chip;
   materials of the sub-mount and the heat sink and the distance D are set to satisfy the following relation:
   $$D \leq 5.48 \times R^{-2.13}.$$

2. A semiconductor laser device according to claim 1, wherein the linear expansion coefficient ratio R of the heat sink to the sub-mount is not lower than 1.

3. A semiconductor laser device according to claim 1, wherein aluminum nitride or silicon carbide is used for the sub-mount, and copper-tungsten is used for the heat sink.

4. A semiconductor laser device according to claim 1, wherein silver-tin solder or gold-tin solder is used for the solder layer.

5. A light scanner comprising:
   a light source; and
   a rotary polygon mirror with a reflective surface for deflecting a light beam from the light source so as to perform scanning therewith;
   wherein the light source is a semiconductor laser device according to claim 1.

6. An image forming apparatus comprising:
   a photoconductor;
   a charger for charging the photoconductor;
   a light scanner for scanning the photoconductor with a light beam to thereby form an electrostatic latent image on the photoconductor;
   a developing unit for applying toner to the electrostatic latent image to thereby form a toner image;
   a transfer unit for transferring the toner image onto a recording medium; and
   a fixing unit for fixing the transferred toner image onto the recording medium;
   wherein the light scanner is a light scanner according to claim 5.

* * * * *